(12) United States Patent
Koo et al.

(10) Patent No.: US 8,785,792 B2
(45) Date of Patent: Jul. 22, 2014

(54) CASE STRUCTURE HAVING FILM TYPE ELECTRONIC CIRCUIT AND METHOD OF MANUFACTURING THE SAME

(75) Inventors: Ja Myeong Koo, Suwon-si (KR); Soon Min Hong, Seoul (KR); Tae Sang Park, Seoul (KR); Young Jun Moon, Hwaseong-si (KR); Gyun Heo, Seoul (KR); Sun Gu Yi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 219 days.

(21) Appl. No.: 13/177,199

(22) Filed: Jul. 6, 2011

(65) Prior Publication Data

US 2012/0018186 A1     Jan. 26, 2012

(30) Foreign Application Priority Data

Jul. 22, 2010    (KR) ........................ 10-2010-0070834

(51) Int. Cl.
*H01L 23/28*      (2006.01)
(52) U.S. Cl.
USPC ........................................ 174/524; 174/560

(58) Field of Classification Search
USPC .......................................... 174/564, 560, 524
See application file for complete search history.

(56) References Cited

U.S. PATENT DOCUMENTS

| 4,480,148 | A  | * | 10/1984 | Archer ............................ 174/51 |
| 6,222,122 | B1 | * | 4/2001  | Davidson ...................... 174/554 |
| 6,713,677 | B2 | * | 3/2004  | Fischbach et al. ............ 174/536 |

* cited by examiner

*Primary Examiner* — Hung Ngo
(74) *Attorney, Agent, or Firm* — Harness, Dickey & Pierce, P.L.C.

(57) ABSTRACT

Disclosed herein is a case structure of an electronic product to which a film-type electronic circuit is adhered. The case structure may include a case of an electronic product and a first film adhered to the case. The case structure may further include a second film adhered to the first film such that one surface of the second film contacts the first film, and an electronic circuit layer adhered to the first film. The electronic circuit layer may be arranged between the first film and the second film, wherein the first film is thermally adhered to the case. The first film may have a melting at a melting point that is lower than a heat-resistant temperature of the case.

17 Claims, 13 Drawing Sheets

CASE STRUCTURE HAVING FILM TYPE ELECTRONIC CIRCUIT AND METHOD OF MANUFACTURING THE SAME

CROSS-REFERENCE TO RELATED APPLICATION(S)

This application claims priority under 35 U.S.C. §119 to Korean Patent Application No. 2010-0070834, filed on Jul. 22, 2010 in the Korean Intellectual Property Office (KIPO), the entire contents of which is incorporated herein by reference.

BACKGROUND

1. Field

Example embodiments relate to a case structure having a film-type electronic circuit and a method for manufacturing the same.

2. Description of the Related Art

In the conventional art, portable electronic products, for example, portable multimedia and portable telecommunications equipment, have increased in popularity. As various functions are continuously added to such portable electronic products, an increasing number of electronic circuits is required to perform these functions. In addition, in order to realize easy portability and excellent external design, slimness of the exterior of the electronic products is desired.

For mobile communication terminals, for example, mobile phones, one type antennas are important for mobile communication. Conventional antennas are divided into an external- and internal-type. External antennas are disadvantageously readily broken by external physical force. Other disadvantages of external antennas are that protrusions which extend outward electronic products are difficult to make small and thus decreasing a portability of the electronic products. On the other hand, unlike external antennas, internal antennas are less likely to break, but are disadvantageously difficult to miniaturize due to their physical sizes.

Recently, forming an antenna within the case of a mobile communication terminal has been employed for efficient space utilization. In this case, antennas are manufactured in the form of flexible PCBs and are thus adhered to cases of mobile communication terminals.

SUMMARY

In accordance with example embodiments, provided is a case structure of an electronic product to which a film-type electronic circuit is adhered.

In accordance with example embodiments, a case structure of an electronic product may include a case, a first film adhered to the case, a second film adhered to the first film such that one surface of the second film contacts the first film and an electronic circuit layer between the first film and the second film. In example embodiments the case may be comprised of a material having a heat-resisting temperature and the first film may have a first melting temperature. In example embodiments the electronic circuit layer may be adhered to the first film. Furthermore, in example embodiments, the heat-resisting temperature of the case may be higher than the first melting temperature.

In accordance with example embodiments, a case structure of an electronic product may include a case, an insulating film adhered to the case, and an electronic circuit layer between the insulating film and the case. In example embodiments, the case may have a heat-resisting temperature and the insulating film may have a first melting temperature, wherein the insulating film heat-resisting temperature is higher than the first melting temperature. In example embodiments the electronic circuit layer may be adhered to the insulating film.

In example embodiments, a method for manufacturing a case structure of an electronic product case may include preparing a case having a heat-resisting temperature, preparing a first film having a first melting temperature, forming an electronic circuit layer on the first film, adhering a second film to the first film such that the electronic circuit layer is between the first film and the second film, and thermally adhering the first film to the case by heating the first film to a temperature at or above the first melting temperature.

In accordance with example embodiments a method for manufacturing a case structure of an electronic product may include preparing a case having a heat-resisting temperature, preparing an insulating film having a first melting temperature, forming an electronic circuit layer on the insulating film, and thermally adhering the insulating film to the case at an adhesion temperature lower than a heat-resisting temperature of the case and higher than the first melting temperature, such that the electronic circuit layer is arranged between the insulating film and the case.

In accordance with example embodiments, a case structure of an electronic product may include a case of an electronic product, the case having a heat-resisting temperature, an insulating film having a first surface adhered to the case, the insulating film having a melting point, and an electronic circuit layer adhered to a second surface of the insulating film. In example embodiments the insulating film may be a hot melt adhesive film, and the melting temperature of the insulating film may be less than the heat-resisting temperature.

In accordance with example embodiments a case structure may include an electronic circuit layer adhered to a case via a first film, the first film having a melting temperature lower than a heat-resisting temperature of the case.

In example embodiments the case structure may include a case of an electronic product, a first film adhered to the case, the first film melting at a melting point or higher and providing adhesivity, a second film adhered to the first film such that one surface of the second film contacts the first film, and an electronic circuit layer adhered to the first film, the electronic circuit layer arranged between the first film and the second film. In example embodiments the first film is thermally adhered to the case at an adhesion temperature which is lower than a heat-resisting temperature of the case and is higher than the melting point.

The first film may be a hot melt adhesive film.

The thickness of the first film may be 100 μm or lower.

The second film is in a solid state at the adhesion temperature.

The case may further include a connection part arranged in the second film, to electrically connect the electronic circuit layer to the outside.

The second film may be a thermoplastic resin film which melts at a predetermined temperature and provides adhesivity, wherein the electronic circuit layer is thermally adhered to the first film and the second film.

In example embodiments, the case structure may further include a protective layer adhered to the second film, to protect the electronic circuit layer.

In accordance with example embodiments, a case structure of an electronic product may include a case of an electronic product, an insulating film adhered to the case, the insulating film melting at a melting point or higher and providing adhesivity, and an electronic circuit layer adhered to the insulating film, the electronic circuit layer arranged between the insulating film and the case. In example embodiments, the insulating film may be thermally adhered to the case at an adhesion temperature which is lower than a heat-resisting temperature of the case and is higher than the melting point thereof.

The case structure may further include a protective layer adhered to the insulating film, to protect the insulating film and the electronic circuit layer.

The first film may be a hot melt adhesive film.

The case structure may further include: a connection part arranged in the insulating film, to electrically connect the electronic circuit layer to the outside.

In accordance with example embodiments, a method for manufacturing a case structure of an electronic product case may include preparing a case, preparing a first film providing adhesivity at a melting point or higher and a second film laminated on the first film, adhering an electronic circuit layer to the first film, adhering the second film to the first film such that the electronic circuit layer is interposed between the first film and the second film, and thermally adhering the first film to the case by heating.

The adhesion of the electronic circuit layer to the first film may be carried out by thermally adhering a metal foil to the first film at the melting point or higher and etching the metal foil in the form of a circuit pattern.

The adhesion of the electronic circuit layer to the first film may be carried out by plating a metal in the form of a circuit pattern on the first film.

The adhesion of the electronic circuit layer to the first film may be carried out by processing a metal foil in the form of a circuit pattern and thermally adhering the metal foil to the first film at the melting point or higher.

The first film may be a hot melt adhesive film.

The second film may be thermally adhered to the first film at a temperature at which the first film provides adhesivity, and the temperature at which the second film is thermally adhered to the first film is lower than a heat-resisting temperature of the second film.

In example embodiments, the method may further include forming a connection part on the first film and the second film to electrically connect the electronic circuit layer to the outside.

The second film may be a thermoplastic resin film which melts at a predetermined temperature and provides adhesivity, wherein the electronic circuit layer is adhered to the first film by thermal adhesion to the first film and the second film.

The method may further include adhering a protective layer to the second film to protect the second film.

The case, the electronic circuit layer and the second film may be adhered to the first film by performing thermal adhesion once.

In accordance with example embodiments, a method for manufacturing a case structure of an electronic product may include preparing a case to form the exterior of an electronic product, preparing an insulating film providing adhesivity at a melting point or higher and an electronic circuit layer adhered to the insulating film, and thermally adhering the insulating film to the case at an adhesion temperature lower than a heat-resisting temperature of the case and higher than the melting point, such that the electronic circuit layer is arranged between the insulating film and the case.

In example embodiments, the method may further include adhering a protective layer to the insulating film to protect the insulating film.

The insulating film may be a hot melt adhesive film.

In example embodiments, the method may further include forming a connection part on the first film and the second film to electrically connect the electronic circuit layer to the outside.

In accordance with example embodiments, a case structure of an electronic product may include a case of an electronic product, an insulating film having one surface adhered to the case, the insulating film melting at a melting point or higher and providing adhesivity, and an electronic circuit layer adhered to the other surface of the insulating film. In example embodiments the insulating film may be a hot melt adhesive film and the insulating film may be thermally adhered to the case at an adhesion temperature which is lower than a heat-resisting temperature of the case and is higher than the melting point.

The case structure may further include a protective layer adhered to the insulating film, to protect the electronic circuit layer.

The case structure having the afore-mentioned configuration reduces the thickness of a film-type electronic circuit and thus realizes slimness of electronic products, since the insulating film serves as both an insulator and an adhesive.

In addition, the case structure eliminates the necessity of using additional adhesive agents and expensive flexible PCBs, thus reducing manufacturing costs. In addition, the case structure can advantageously utilize conventional equipment to form electronic circuits on a substrate in the process of manufacturing film-type electronic circuits.

BRIEF DESCRIPTION OF THE DRAWINGS

These and/or other aspects of example embodiments will become apparent and more readily appreciated from the following description taken in conjunction with the accompanying drawings of which.

DETAILED DESCRIPTION

Figure 1:
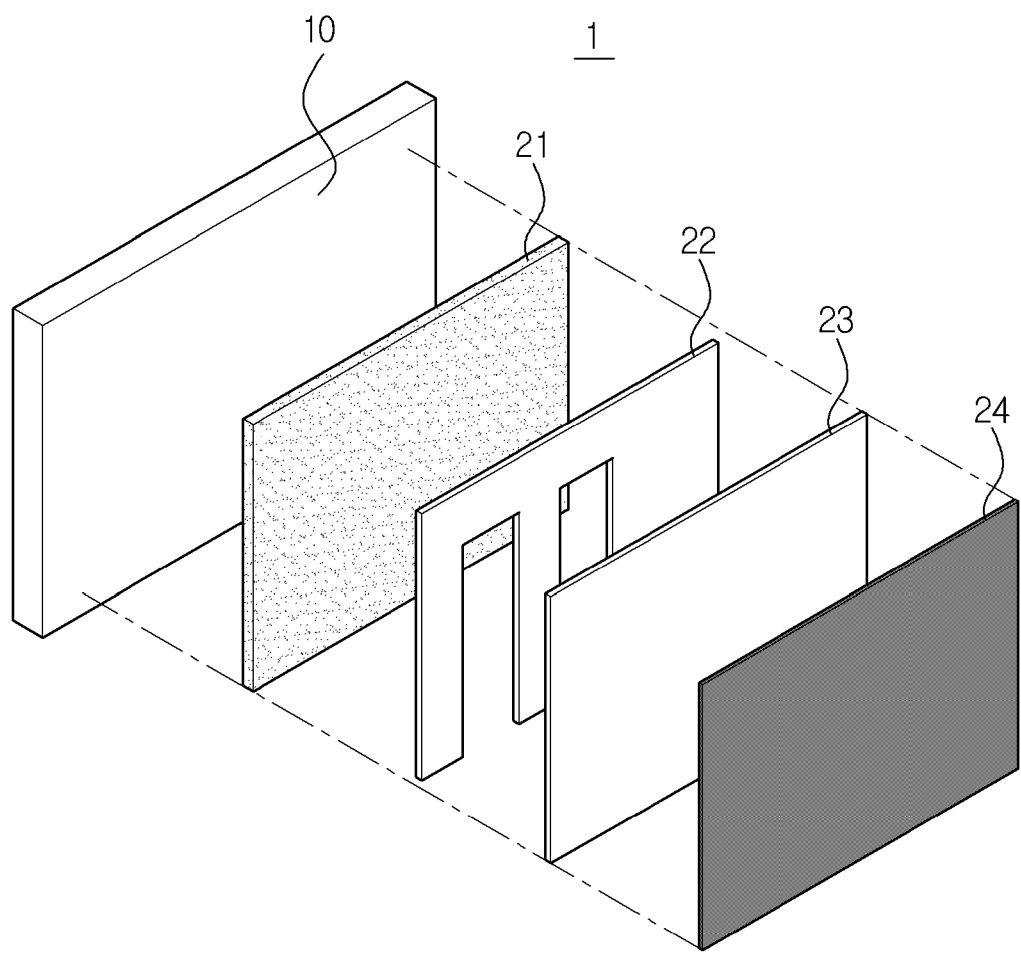
FIG. 1 is an exploded perspective view illustrating a main configuration of a case structure of an electronic product according example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments as illustrated in the accompanying drawings, wherein like reference numerals refer to like elements throughout.

FIG. 1 is an exploded perspective view illustrating a main configuration of a case structure of an electronic product according to example embodiments.

Referring to FIG. 1, a case structure of an electronic product 1 may include a case 10 and a film-type electronic circuit 20 adhered to the case 10.

Portable electronic products, for example, mobile communication terminals, may require external slimness in order to realize convenient portability. For this reason, the thickness of the case 10 may be relatively thin. Furthermore, the case 10 may need to be able to withstand external shock in order to protect internal electronic components from the external shock.

In addition, the film-type electronic circuit 20 may be adhered to an internal surface of the case 10. Accordingly, the case 10 may be made of a material, allowing adhesion of the film-type electronic circuit 20. Generally, the case 10 may be formed by injection molding a polymer, but may be formed of other materials, for example, fabrics, glasses, and ceramics.

The film-type electronic circuit 20 may include all electronic circuits to be realized in the form of a film. Electronic circuits including communication modules, for example, antennas or RFID of mobile communication terminals and electronic modules provided with connectors or electronic components may be provided as films.

The film-type electronic circuit 20 may be adhered to the manufactured case 10. The film-type electronic circuit 20 may include an electronic circuit layer 22, a first film 21 to which the electronic circuit layer 22 is adhered, and a second film 23. In example embodiments, the electronic circuit layer 22 may be sandwiched between the first film 21 and the second film 23 as shown in FIG. 1.

The electronic circuit layer 22 may be an antenna of a mobile communication terminal. The material for the electronic circuit layer 22 may be made of a conductive metal, for example, copper, silver, nickel, gold or platinum. The electronic circuit layer 22 may be adhered to the first film 21 in the form of a metallic foil molded into a circuit pattern, or plated on the first film 21 in the form of a circuit pattern.

The electronic circuit layer 22 may be fixed on the case 10 by thermally adhering the first film 21 to the case 10. The first film 21 may be a relatively stable solid at ambient temperature, but may melt and provide adhesivity at a melting point or higher. The first film 21 may be manufactured with a material which does not conduct electricity. Generally, the first film 21 may be manufactured using a thermoplastic resin which may melt at a melting point or higher and may solidify below the melting point. As such, the first film 21 may insulate the electronic circuit layer 22 from the outside and, at the same time, may be directly thermally adhered to the case 10. Accordingly, the first film 21 may serve as both an insulating agent and an adhesive agent, thus realizing slimness of electronic products, as compared to FPCBs using a separate adhesive agent.

The first film 21 may be a hot melt adhesive film. The hot melt adhesive film may be a film similar or identical to a film used to adhere sponges of liners in shoes to fabrics or clothes, which has an advantage of providing superior adhesion in spite of a relatively small thickness. In addition, the hot melt adhesive film may be firmly adhered to glass, ceramics, metals or fabrics, for example, natural fibers as well as polymers. Accordingly, the first film 21, as a hot melt adhesive film, may be adhered to the case 10 that may be made of various materials.

Generally, the thickness of the first film 21 may be about 500 μm or less, but may be as small as possible in order to realize slimness of electronic products. Sufficient adhesion to the case 10 is required. The hot melt adhesive film may exhibit superior adhesion despite of having a relatively small thickness of 10 to 100 μm. Hot melt adhesive films have advantages of being thin and cheap, as compared to insulating layers used for FPCBs.

The second film 23 may reinforce surface hardness and strength of film-type electronic circuit 20 and thus may protect the electronic circuit layer 22 and the first film 21.

The second film 23 may be a general film, examples of which include polyethylene terephthalate (PET), polyethylene naphthalate (PEN), poly carbonate (PC), acrylonitrile butadiene styrene (ABS), and poly urethane (PU). In addition, the second film 23 may be manufactured using an insulating material.

The second film 23 may be a stable solid at ambient temperature, but may be modified at a heat-resisting temperature or higher. The second film 23 may prevent or reduce deformation of the electronic circuit layer 22 in the process of manufacturing the case structure 1 and may not modified in the process of thermally adhering the first film 21 to the case 10. Accordingly, a temperature at which the first film 21 is thermally adhered to the case 10 may be lower than a heat-resisting temperature of the second film 23. In example embodiments, a "heat-resisting temperature" is related to a temperature to which a material may be heated without significantly weakening or deforming the material.

In addition, similar to the first film 21, the second film 23 may be a thermoplastic resin which may provide adhesivity at a melting point or higher, or a hot melt adhesive film. The second film 23 may be the same material as the first film 21. In example embodiments, in order to reinforce surface hardness and strength of the film-type electronic circuit 20, a protective layer 24 may be additionally adhered to the second film 23. The protective layer 24 may be provided as a coating layer coated on the second film 23, or a film-type protective film.

Figure 2A:
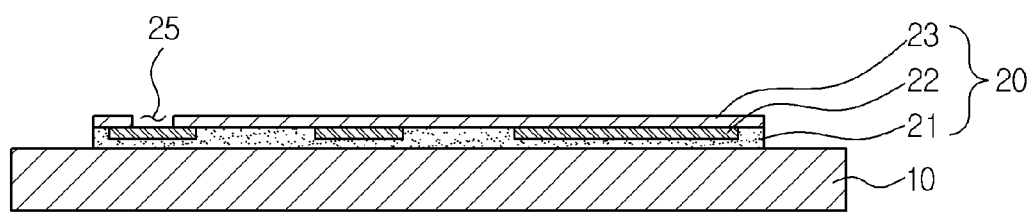
FIG. 2A is a sectional view illustrating a case structure of an electronic product according to example embodiments.

FIG. 2A is a sectional view illustrating a case structure of an electronic product according to example embodiments. As shown in FIG. 2A, the case structure 1 may be formed by laminating a case 10, a first film 21 and an electronic circuit layer 22 in this order.

In addition, a second film 23 may be adhered to the first film 21. In this case, the case 10 may be thermally adhered to one surface of the first film 21 and the second film 23 may be adhered to the other surface thereof. The electronic circuit layer 22 may be arranged between the first film 21 and the second film 23. Accordingly, the second film 23 may protect the electronic circuit layer 22 from deformation and breakage, and from external shocks in the process of manufacturing the case structure 1.

In example embodiments, in order to protect the electronic circuit layer 22, the protective layer 24 shown in FIG. 1, instead of, or in addition to, the second film 23, may be adhered to the first film 21.

To electrically connect the electronic circuit layer 22 to the exterior of the film-type electronic circuit 20, a connection part 25 may be formed. In example embodiments, the electronic circuit layer 22 may be electrically connected through the connection part 25 to electronic components arranged inside the case structure 1.

Figure 2B:
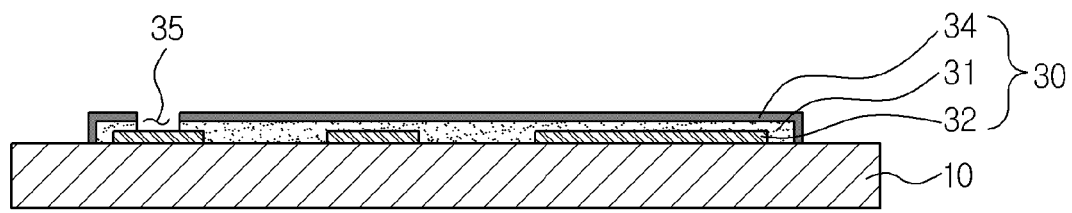
FIG. 2B is a sectional view illustrating the case structure according to example embodiments.

FIG. 2B is a sectional view illustrating a case structure according to example embodiments. As shown in FIG. 2B, an electronic circuit layer 32 may be arranged between the case 10 and an insulating film 31. Accordingly, the electronic circuit layer 32 may be primarily protected from the outside through the insulating film 31.

In order to protect the insulating film 31 and the electronic circuit layer 32, a protective layer 34 may be additionally adhered to the insulating film 31. The insulating film 31 and the protective layer 34 may be the same as the first film 21 and the protective layer 24 shown in FIG. 1, respectively.

A connection part 35 may be formed to allow communication between the electronic circuit layer 32 and the exterior of the film-type electronic circuit 30.

Figure 2C:
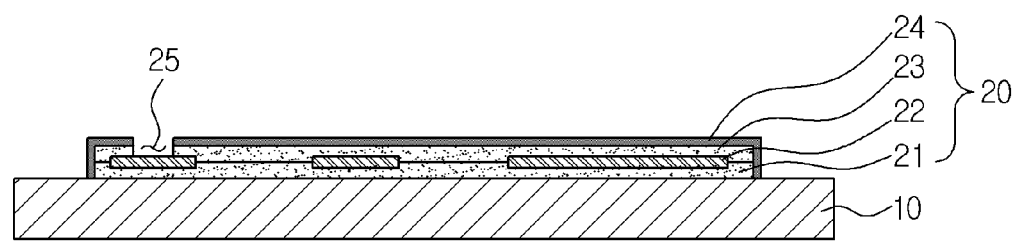
FIG. 2C is a sectional view illustrating a case structure of an electronic product according to example embodiments.

FIG. 2C is a sectional view illustrating a case structure of an electronic product according to example embodiments. As shown in FIG. 2C, the case structure 1 may be formed by sequentially laminating a case 10, a first film 21, an electronic circuit layer 22 and a second film 23. Like the first film 21, the second film 23 may be a thermoplastic resin which may provide adhesivity at a melting point or higher, or a hot melt adhesive film. The second film 23 may be the same as the first film 21.

The second film 23 may be an adhesive thermoplastic resin, thus allowing an electronic circuit layer 22 arranged between the first film 21 and the second film 23 to be thermally adhered to the first film 21 and the second film 23.

The electronic circuit layer 22 may be primarily protected from the outside through the second film 23, but a protective layer 24 may be additionally adhered to the second film 23, in order to reinforce the surface hardness and strength of the film-type electronic circuit 20. In example embodiments, the electronic circuit layer 22 may be exposed by a connection part 25 so that the electronic circuit layer 22 may be connected to components arranged outside of the electronic circuit layer 22.

FIGS. 3A to 3D are views illustrating a process for manufacturing a case for an electronic product according to example embodiments.

Figure 3A:
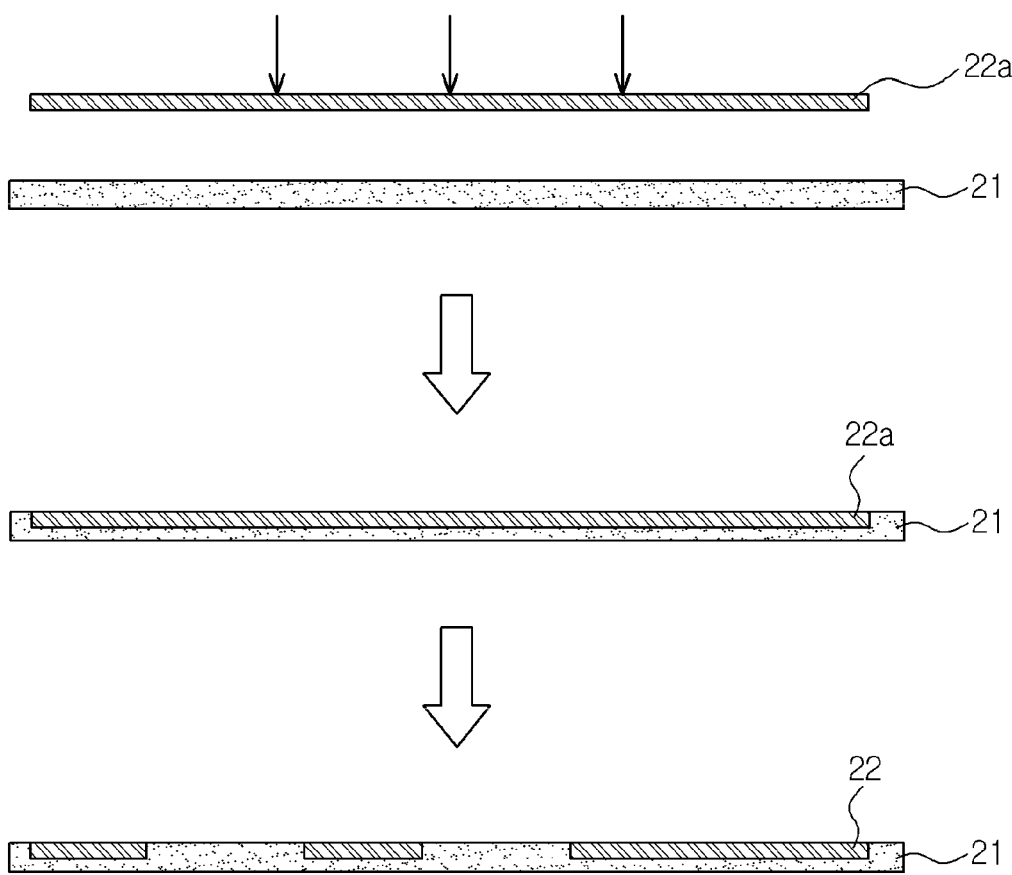
FIGS. 3A to 3E are views illustrating a process for manufacturing a case structure of an electronic product according to example embodiments.

FIG. 3A illustrates a process for adhering the electronic circuit layer 22 to the first film 21.

In example embodiments, the first film 21 may be a stable solid at ambient temperature, but may melt and provide adhesivity at a melting point or higher. The first film 21 may be generally manufactured using a thermoplastic resin. The first film 21 may be a hot melt adhesive film.

The electronic circuit layer 22 may be a conductive metal foil 22a, for example, a metal foil comprised of copper, silver, nickel, gold or platinum. The metal foil 22a may be thermally adhered to the first film 21 by applying heat and pressure thereto at a melting point or higher of the first film 21. In addition, the metal foil 22a adhered to the first film 21 may be etched in the form of a circuit pattern to form the electronic circuit layer 22. The etching process may utilize an etching solution to etch and/or melt the metal foil 22a.

In addition, the electronic circuit layer 22 may be formed by plating the metal in the form of a circuit pattern on the first film 21. General methods for forming electronic circuits on a substrate, for example, electroplating, electroless plating, printing or physical vapor deposition (PVD) may be used.

In addition, the metal foil 22a may be formed in the form of a circuit pattern to pre-form the electronic circuit layer 22 and the electronic circuit layer 22 may be thermally adhered to the first film 21 at a melting point or higher.

A temperature at which the metal foil 22a or the electronic circuit layer 22 is thermally adhered to the first film 21 may be higher than a temperature at which the first film 21 provides adhesivity.

Figure 3B:
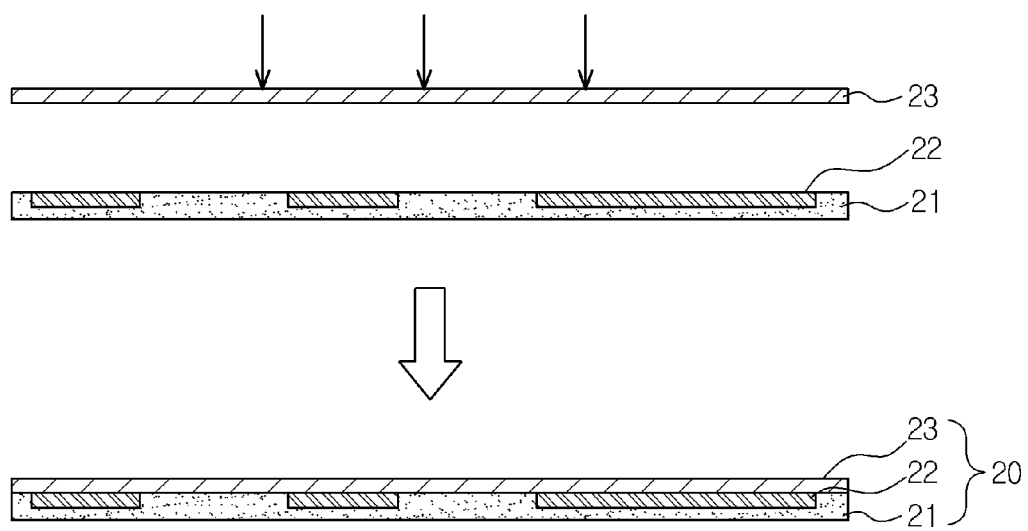

FIG. 3B illustrates a process for adhering the second film 23 to the first film 21.

The second film 23 may be thermally adhered to the first film 21 such that the electronic circuit layer 22 is arranged between the first film 21 and the second film 23.

The second film 23 may reinforce surface hardness and strength of the film-type electronic circuit 20 and thus may protect the electronic circuit layer 22 and the first film 21. The material for the second film 23 may be PET, PEN, PC, ABS or PU. This process temperature may be higher than a melting point of the first film 21 and may be lower than a heat-resisting temperature of the second film 23. Accordingly, at such a process temperature, the first film 21 may provide sufficient adhesivity and the second film 23 maintains its original shape.

In addition, like the first film 21, the second film 23 may be manufactured using a thermoplastic resin which may melt at a melting point or higher or a hot melt adhesive film. In addition, the second film 23 may be the same as the first film 21. Accordingly, the electronic circuit layer 22 may be arranged between the first film 21 and the second film 23 and may be adhered to the first film 21 and the second film 23. This process temperature may be higher than a melting point at which the first film 21 provides adhesivity and a melting point at which the second film 23 provides adhesivity.

Figure 3C:
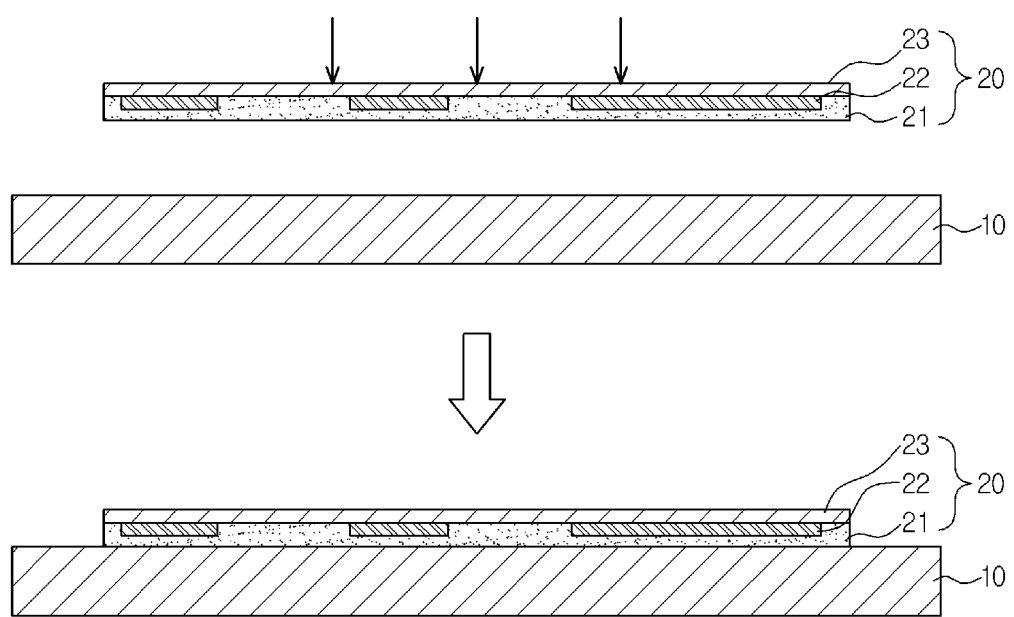

FIG. 3C illustrates a process for adhering a film-type electronic circuit 20 to the case 10 of an electronic product.

The case 10 may be prepared separately from the process of manufacturing the film-type electronic circuit 20. The case 10 may be a material to which the first film 21 may be adhered. The case 10 may be formed by injection molding a polymer, but example embodiments are not limited thereto. For example, the case may be formed using another material, for example, a fabric, a metal, a ceramic, or a glass.

The first film 21 may be thermally adhered to the case 10. The thermal adhesion may be carried out at a temperature which is lower than a heat-resisting temperature of the case 10 and a melting point of the first film 21 at which the first film 21 provides adhesivity. For example, the thermal adhesion may be carried out at a temperature which is lower than a heat-resisting temperature of the case 10 and at or above a melting point of the first film 21. Accordingly, in this process, deformation of the case 10 may be prevented or reduced.

The first film 21 may be a hot melt adhesive film. The melting point of the hot melt adhesive film may be varied by controlling constituent ingredients thereof. Accordingly, when a case 10 having a lower heat-resisting temperature is used, a hot-melt adhesive film having a lower heat-resisting temperature may be used, to make the thermal adhesion temperature lower than the heat-resisting temperature of the case 10.

The process for adhering the second film 23 shown in FIG. 3B may be carried out prior to the process for adhering the first film 21 to the case 10 shown in FIG. 3C. If necessary, the process shown in FIG. 3C may be carried out prior to the process shown in FIG. 3B.

In addition, the case 10, the first film 21, the electronic circuit layer 22 and the second film 23 may be sequentially laminated and thermal adhesion may be performed once to form a case structure of an electronic product 1. At this time, the electronic circuit layer 22 may be pre-formed in the form of a circuit pattern prior to lamination.

Figure 3D:
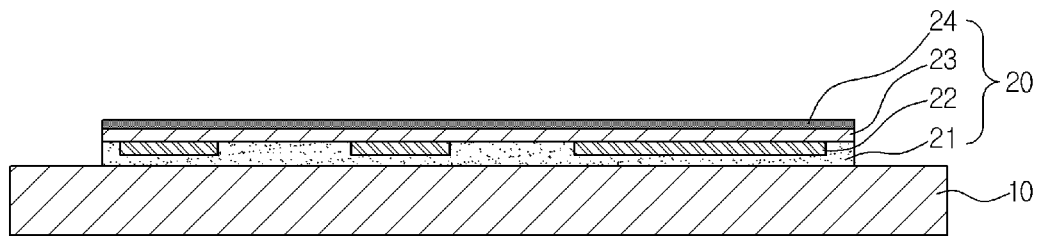

FIG. 3D illustrates a process for adhering the protective layer 24 to the second film 23.

In order to reinforce surface hardness and strength of the film-type electronic circuit 20, the protective layer 24 may be adhered to the second film 23. The protective layer 24 may be a coating layer coated on the second film 23 or a film-type protective film. The coating layer may be made of a ceramic.

Figure 3E:
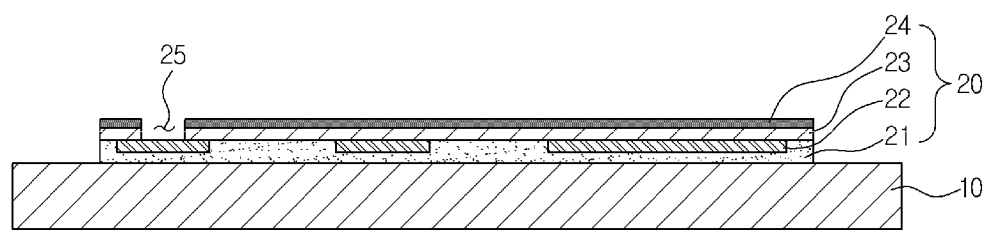

FIG. 3E illustrates a process for forming a connection part 25 on the film-type electronic circuit 20.

The connection part 25 may be formed by removing the second film 23 and the protective layer 24 such that the electronic circuit layer 22 is exposed to allow communication with the outside of the film-type electronic circuit 20. The formation of the connection part 25 may be carried out by laser irradiation or mechanical processing, or using a masking tape.

FIGS. 4A to 4D are views illustrating a process for manufacturing a case for an electronic product according to example embodiments.

Figure 4A:
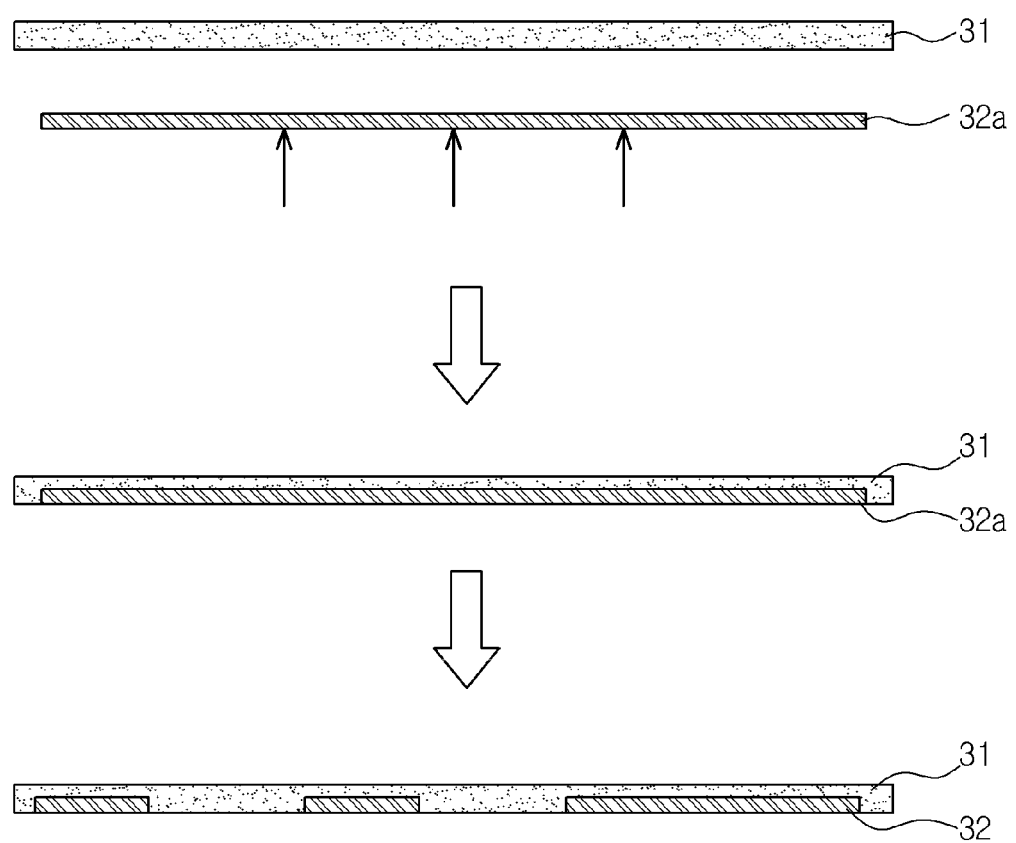
FIGS. 4A to 4D are views illustrating a process for manufacturing a case structure of an electronic product according to example embodiments.

FIG. 4A illustrates a process for adhering the electronic circuit layer 32 to the insulating film 31.

The insulating film 31 and the electronic circuit layer 32 may be the same as the first film 21 and the electronic circuit layer 22, shown in FIG. 3A, and the metal foil 32a may be the same as the metal foil 22a shown in FIG. 3A. The process for adhering the electronic circuit layer 32 to the insulating film 31 is illustrated with reference to FIG. 3A above.

Figure 4B:
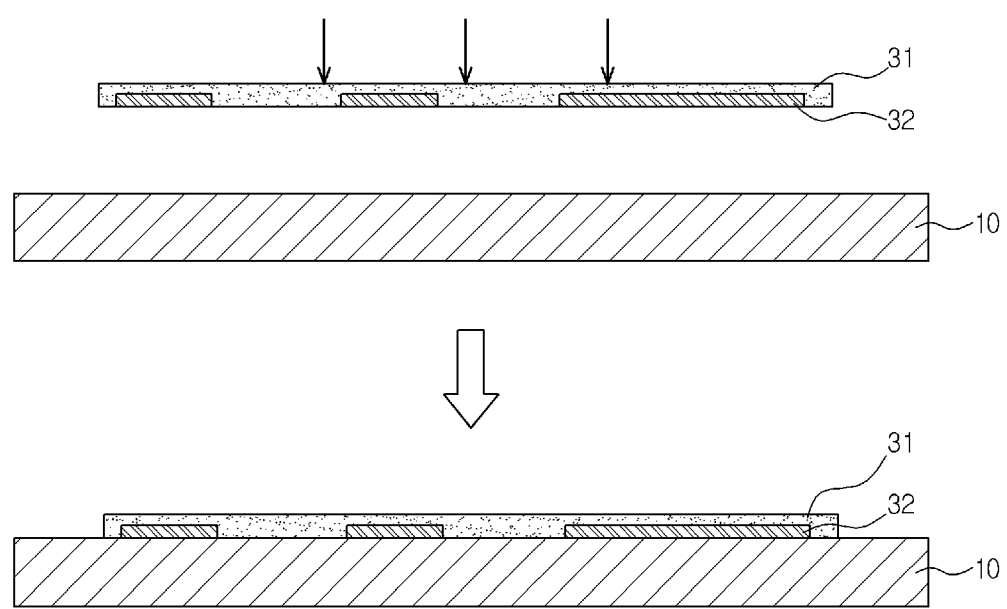

FIG. 4B illustrates a process for adhering a film-type electronic circuit 30 to the case 10 of an electronic product.

The case 10 used herein may be the same as the case 10 illustrated in FIG. 3C. The insulating film 31 may be thermally adhered to the case 10 such that the electronic circuit layer 32 is arranged between the case 10 and the insulating film 31. This process temperature may be higher than a melting point of the insulating film 31 at which the insulating film 31 begins to provide adhesivity and is lower than a heat-resisting temperature of the case 10.

In addition, the process shown in FIG. 4A and the process shown in FIG. 4B may be performed simultaneously. The case structure 1 may be formed by sequentially laminating the case 10, the electronic circuit layer 32 and the insulating film 31 and performing thermal adhesion once. In example embodiments, the electronic circuit layer 32 may be pre-formed in the form of a circuit pattern prior to lamination.

Figure 4C:
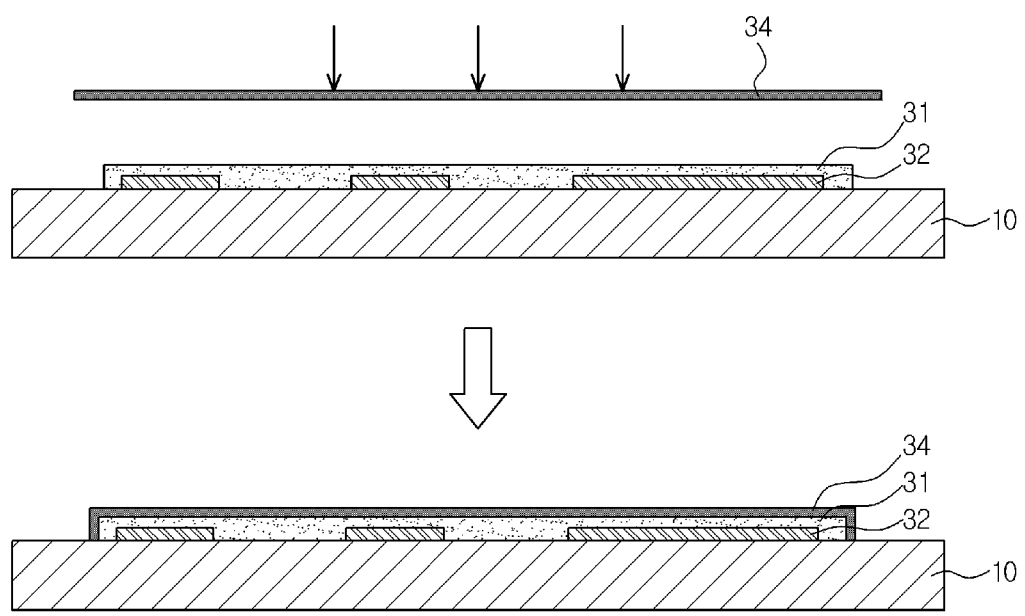

FIG. 4C illustrates a process for adhering the protective layer 34 to the insulating film 31.

The protective layer 34 may be the same as the protective layer 24 shown in FIG. 3D. The electronic circuit layer 32 may be primarily protected through the insulating film 31, but the protective layer 34 may be additionally adhered to the insulating film 31 to reinforce surface hardness and strength of the film-type electronic circuit 30.

Figure 4D:
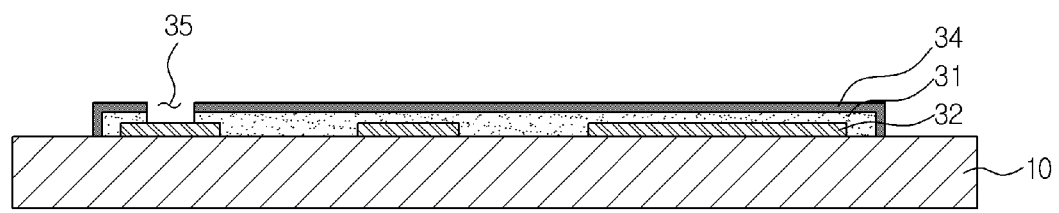

FIG. 4D illustrates a process for forming a connection part 35 on the film-type electronic circuit 30.

The connection part 35 may be the same as the connection part 25 shown in FIG. 3E.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A case structure of an electronic product comprising:
   a case, the case being comprised of a material having a heat-resisting temperature;
   a first film adhered to the case, the first film having a first melting temperature;
   a second film adhered to the first film such that one surface of the second film contacts the first film; and an electronic circuit layer between the first film and the second film, the electronic circuit layer being adhered to the first film wherein the heat-resisting temperature of the case is higher than the first melting temperature.

2. The case structure according to claim 1, wherein the first film is a hot melt adhesive film.

3. The case structure according to claim 1, wherein a thickness of the first film is about 100 µm or less.

4. The case structure according to claim 1, wherein the second film is in a solid state at the first melting temperature.

5. The case structure according to claim 1, wherein a portion of the electronic circuit layer is exposed through a connection part of the second film.

6. The case structure according to claim 1, wherein the second film is a thermoplastic resin film having a second melting temperature and the electronic circuit layer is adhered to the first film and the second film.

7. The case structure according to claim 6, further comprising:
 a protective layer adhered to the second film, the protective layer being configured to protect the electronic circuit layer.

8. A method for manufacturing a case structure of an electronic product case, comprising:
 preparing a case having a heat-resisting temperature;
 preparing a first film having a first melting temperature;
 forming an electronic circuit layer on the first film;
 adhering a second film to the first film such that one surface of the second film contacts the first film, and the electronic circuit layer is between the first film and the second film; and
 thermally adhering the first film to the case by heating the first film to a temperature which is higher than the first melting temperature and is lower than a heat-resisting temperature of the case.

9. The method according to claim 8, wherein forming the electronic circuit layer on the first film includes thermally adhering a metal foil to the first film at the first melting temperature or higher and etching the metal foil to form of a circuit pattern.

10. The method according to claim 8, wherein forming the electronic circuit layer on the first film includes plating a metal in the form of a circuit pattern on the first film.

11. The method according to claim 8, wherein forming the electronic circuit layer on the first film includes processing a metal foil in the form of a circuit pattern and thermally adhering the processed metal foil to the first film at the first melting temperature or higher.

12. The method according to claim 8, wherein the first film is a hot melt adhesive film.

13. The method according to claim 8, wherein adhering the second film to the first film includes heating the first film to a temperature between the first melting temperature and the heat-resisting temperature.

14. The method according to claim 8, further comprising:
 forming a connection part through at least one of the first and the second films to expose the electronic circuit layer to the outside.

15. The method according to claim 8, further comprising:
 adhering the second film to the electronic circuit layer, wherein the second film is a thermoplastic resin film having a second melting temperature, and adhering the second film to the electronic circuit layer includes thermally adhering the second film to the electronic circuit layer by heating the second film to a temperature that is at or above the second melting temperature.

16. The method according to claim 15, further comprising:
 adhering a protective layer to the second film to protect the second film.

17. The method according to claim 8, wherein the case, the electronic circuit layer and the second film are adhered to the first film by performing thermal adhesion once.

* * * * *